US007026860B1

(12) United States Patent
Gheorghiu et al.

(10) Patent No.: US 7,026,860 B1
(45) Date of Patent: Apr. 11, 2006

(54) COMPENSATED SELF-BIASING CURRENT GENERATOR

(75) Inventors: Virgil ioan Gheorghiu, Campbell, CA (US); Thomas Yang, San Francisco, CA (US)

(73) Assignee: O2Micro International Limited, Grand Cayman (KY)

( * ) Notice: Subject to any disclaimer, the term of this patent is extended or adjusted under 35 U.S.C. 154(b) by 386 days.

(21) Appl. No.: 10/431,814

(22) Filed: May 8, 2003

(51) Int. Cl.
*H03K 1/10* (2006.01)

(52) U.S. Cl. ...................................... 327/513; 327/543

(58) Field of Classification Search ................ 323/312, 323/315, 316; 327/512, 513, 534, 535, 538, 327/539, 543
See application file for complete search history.

(56) References Cited

U.S. PATENT DOCUMENTS

| | | | | |
|---|---|---|---|---|
| 4,763,018 | A * | 8/1988 | Moon | 327/538 |
| 4,833,344 | A * | 5/1989 | Moon et al. | 327/540 |
| 5,034,626 | A * | 7/1991 | Pirez et al. | 327/542 |
| 5,038,053 | A * | 8/1991 | Djenguerian et al. | 327/513 |
| 5,430,395 | A * | 7/1995 | Ichimaru | 327/312 |
| 5,563,502 | A * | 10/1996 | Akioka et al. | 323/313 |
| 5,818,294 | A * | 10/1998 | Ashmore, Jr. | 327/543 |
| 6,051,966 | A | 4/2000 | Pontarollo | 323/31 |
| 6,057,727 | A | 5/2000 | Dautriche et al. | 327/543 |
| 6,107,868 | A * | 8/2000 | Diniz et al. | 327/543 |
| 6,133,718 | A | 10/2000 | Calafato et al. | 323/312 |
| 6,211,661 | B1 | 4/2001 | Eckhardt | 323/316 |
| 6,265,857 | B1 | 7/2001 | Demsky et al. | 323/312 |
| 6,353,365 | B1 | 3/2002 | Barnes | 330/288 |
| 6,448,844 | B1 * | 9/2002 | Cho | 327/538 |
| 6,541,949 | B1 | 4/2003 | Sirito-Olivier | 323/315 |
| 6,737,908 | B1 * | 5/2004 | Mottola et al. | 327/539 |

OTHER PUBLICATIONS

Voltage References from Diodes to Precision High-Order Bandgap Circuits; by Gabriel A. Rincon-Mora, Ph.D., pp. 34-36, no date.

* cited by examiner

*Primary Examiner*—Jeffrey Zweizig
(74) *Attorney, Agent, or Firm*—Grossman, Tucker, Perreault & Pfleger, PLLC

(57) ABSTRACT

A compensated current generator includes a first current source and a second current source coupled in series. The first and second current sources have temperature coefficients with opposite signs to produce a temperature compensated current. The first current source may be a peaking current source biased by a bias signal to operate a peak of its transfer characteristic curve to enhance power supply rejection. An associated method is also provided.

18 Claims, 14 Drawing Sheets

COMPENSATED SELF-BIASING CURRENT GENERATOR

FIELD OF THE INVENTION

This invention relates to current generators and in particular to temperature and power supply compensation of current generators.

BACKGROUND OF THE INVENTION

Current generators are utilized in a variety of circuits and applications. The generation of a constant current level is desirable given, among other things, that many analog circuits may be biased off such current generators. However, such current generators are sensitive to ambient temperature and power supply variations. For example, as ambient temperature varies over a wide range, e.g., from −40 degrees Celsius to +130 degrees Celsius, output current of the current generator may vary widely. In addition, as the power supply voltage level to such a current generator varies, e.g., from about 4.0 volts to 6.5 volts in one instance, the output current of the current generator may also vary widely. Traditional solutions, in one form or another, may use bipolar transistors in a way that a resultant bias current relies on a stringent requirement of a resistor temperature coefficient.

Accordingly, there is a need for a compensated self-biasing current generator that overcomes the above deficiencies in the prior art.

BRIEF SUMMARY OF THE INVENTION

A compensated current generator consistent with the invention includes: a first current source having a first temperature coefficient, the first current source configured to provide a first current; and a second current source having a second temperature coefficient. The second current source coupled in series with the first current source, wherein the first and second temperature coefficients have opposite signs, wherein the second current source is configured to receive the first current and provide a second temperature compensated current.

In another embodiment, a compensated current generator consistent with the invention includes: a first current source having a first temperature coefficient configured to provide a first current during a first time interval; and a second current source having a second temperature coefficient, the second current source coupled in series with the first current source, wherein the first and second temperature coefficients have opposite signs, wherein the second current source provides a second current to the first current source, and wherein the first current source is further configured to provide a third temperature compensated current during a second time interval based on the second current, wherein the second time interval occurs after the first time interval.

In yet another embodiment, a compensated current generator consistent with the invention includes: a peaking current source having a first temperature coefficient configured to provide a first current, wherein the peaking current source has a transfer characteristic curve having a peak, the peaking current source responsive to a bias signal to operate at the peak; a second current source having a second temperature coefficient, the second current source coupled in series with the first current source, wherein the first and second temperature coefficients have opposite signs, wherein the second current source is configured to receive the first current source and provide a second temperature compensated current; a self-biasing circuit configured to provide the bias signal to the peaking current source, a startup current source configured to provide a startup current to the first current source, and wherein a startup switch is coupled to the startup current source, and wherein the startup switch is configured to decouple the startup current source from the first current source once the second temperature compensated current reaches a bias level; a compensated current source configured to receive the second temperature compensated current and provide a third temperature compensated current; and an output circuit configured to receive the third temperature compensated current and provide an output temperature compensated current.

In yet a further embodiment, a method of compensating a current source consistent with the invention includes: generating a first current in a first current source having a first temperature coefficient; and providing the first current to a second current source having a second temperature coefficient, the second current source coupled in series with the first current source, wherein the first and second temperature coefficients have opposite signs.

BRIEF DESCRIPTION OF THE DRAWINGS

For a better understanding of the present invention, together with other objects, features and advantages, reference should be made to the following detailed description which should be read in conjunction with the following figures wherein like numerals represent like parts.

DETAILED DESCRIPTION

Figure 1A:
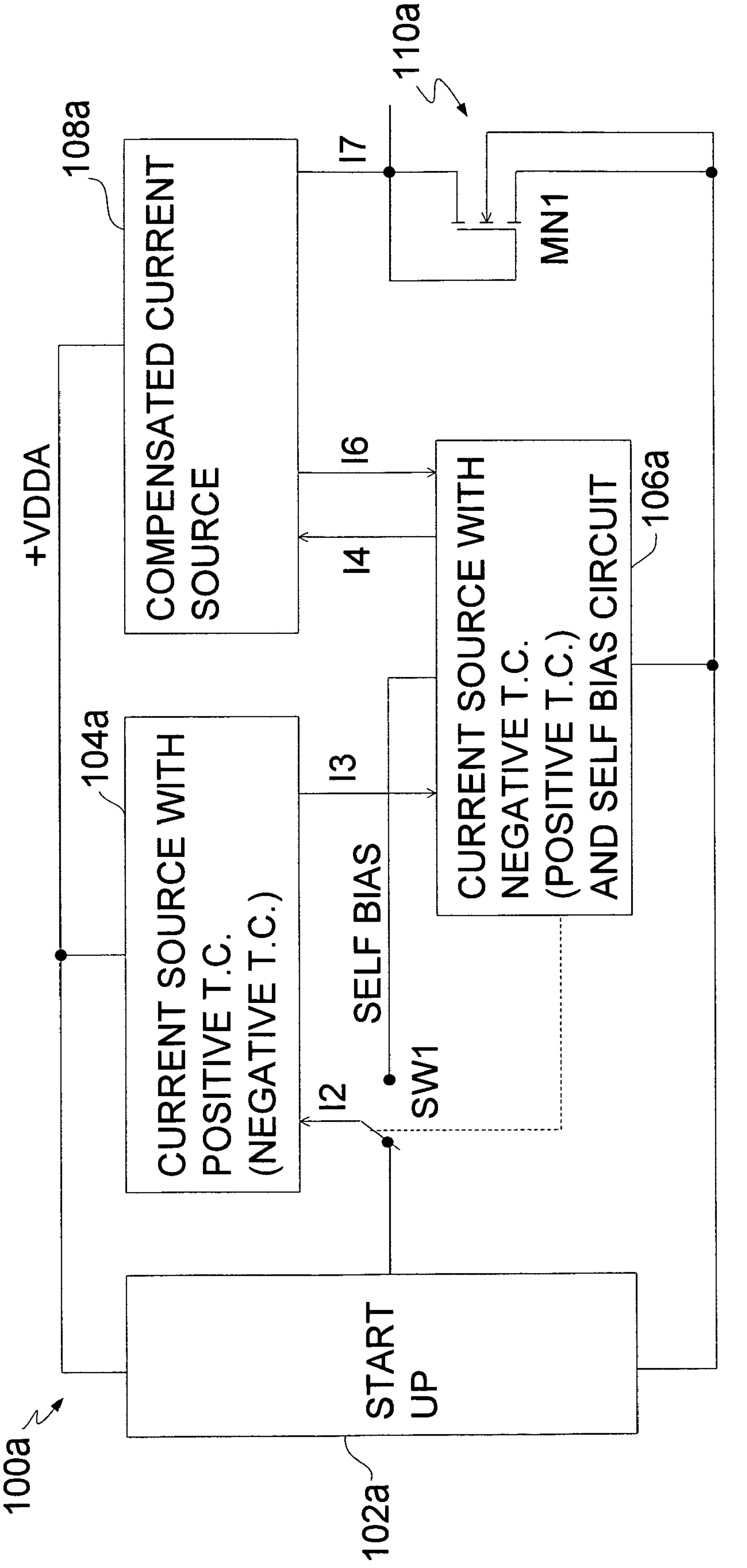
FIG. 1A is a block diagram of an exemplary compensated self-biasing current generator consistent with the invention where the first current source is more suitable for p-channel MOSFETs or PNP bipolar transistors.

Turning to FIG. 1A, a compensated self-biasing current generator 100*a* consistent with the invention is illustrated. In general, the current generator 100*a* may include a start up circuit 102*a*, a first current source 104*a* with a first temperature coefficient, a second current source 106*a* with a second temperature coefficient, a compensated current source 108*a*, and an output circuit 110*a*.

The first temperature coefficient and the second temperature coefficient may have opposite signs. For instance, the first temperature coefficient may be a positive temperature coefficient such that its output current has a positive slope with respect to a positive change in ambient temperature (i.e., the output current increases when the temperature increases). If the first temperature coefficient is a positive temperature coefficient then the second temperature coefficient is a negative coefficient. A current source with a negative temperature coefficient has an output current having a negative slope with respect to a positive change in ambient temperature. Alternatively, the first temperature coefficient may be a negative temperature coefficient and the second temperature coefficient may be a positive temperature coefficient.

For clarity, future discussion is directed to the first current 104*a* source having a positive temperature coefficient and the second current source 106*a* having a negative temperature coefficient although again these could be reversed. In general, the startup circuit 102*a* provides a start up current I2 to activate the first current source 104*a* having a positive temperature coefficient in this instance. The first current source 104*a* then provides an output current I3 having a positive slope with a positive increase in temperature. The second current source 106*a* receives the output current I3 from the first current source 104*a*. The second current source 106*a* may have a negative temperature coefficient in this instance such that the output current I4 of the second current source 106*a* is temperature compensated. The output current I4 may then be input to compensated current source 108*a*. Compensated current source 108*a* may then provide a current reference I7 for the output circuit 110*a*. The compensated current source 108*a* then also provides a current reference I6 for the first current source 104*a* via the second current source 106*a* and switch SW1 ("self-bias" position). The output circuit 110*a* may be a diode connected NMOS transistor MN1 to provide an output current from the compensated self-bias current generator 100*a*. The output circuit 110*a* may also be a diode connected NPN type BJT transistor.

Figure 1B:
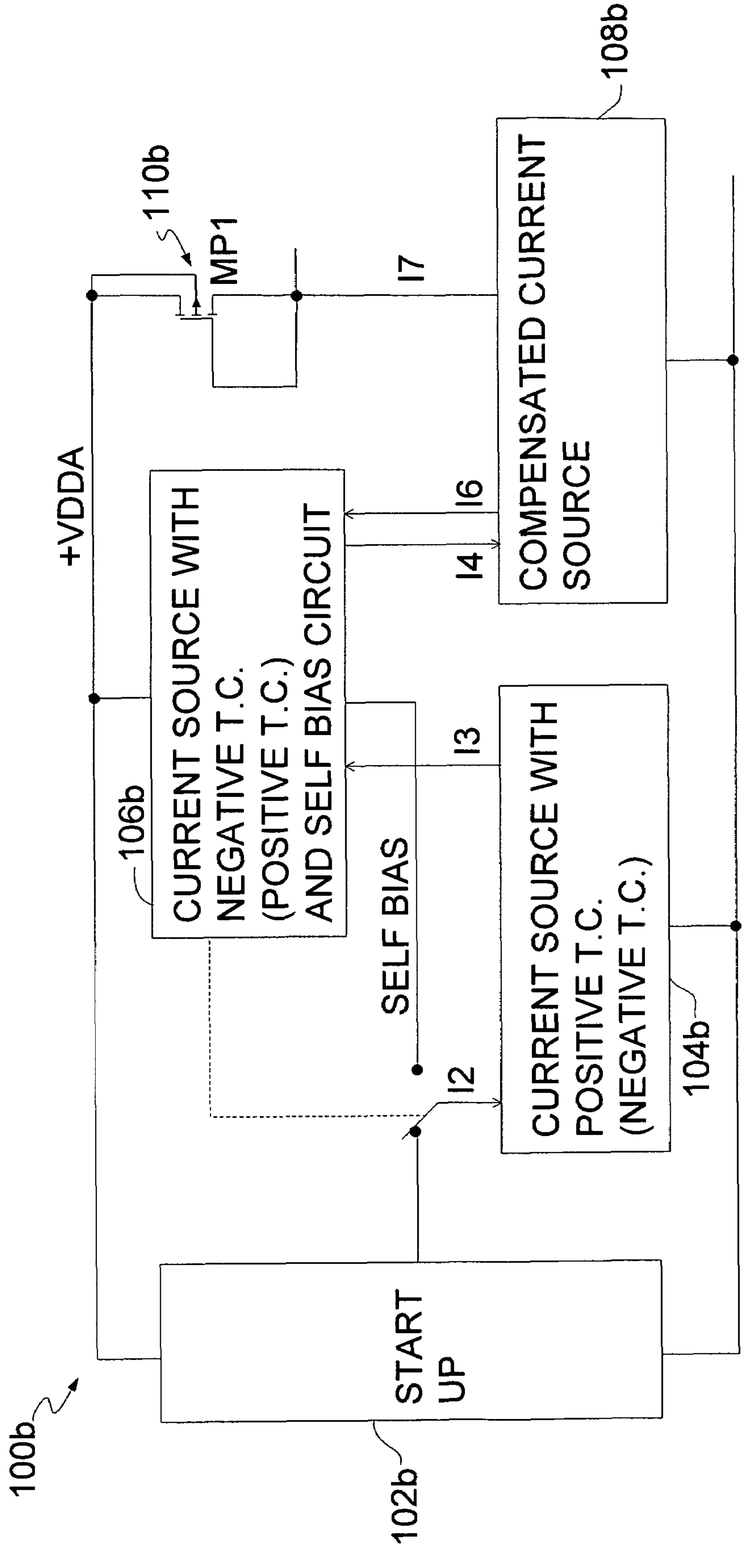
FIG. 1B is a block diagram of another exemplary compensated self-biasing current generator consistent with the invention where the first current source is more suitable for n-channel MOSFETs or NPN bipolar transistors.

FIG. 1A is a configuration where the first current source 104*a* may be made from p-channel MOSFETS or PNP type BJT transistors, while the second current source 106*a* may be made from n-channel MOSFETS or NPN type BJT transistors. In contrast, FIG. 1B illustrates another configuration where the first current source 104*b* may be made from n-channel MOSFETS or NPN type BJT transistors, while the second current source 106*b* may be made from p-type MOSFETS or PNP type BJT transistors. The output circuit 110*b* of FIG. 1B may be a diode connected PMOS transistor MP1 or a PNP type BJT. Otherwise, the basic structure and operation of the current generator 100*b* of FIG. 1B is similar to that of the current generator 100*a* of FIG. 1A.

Figure 2A:
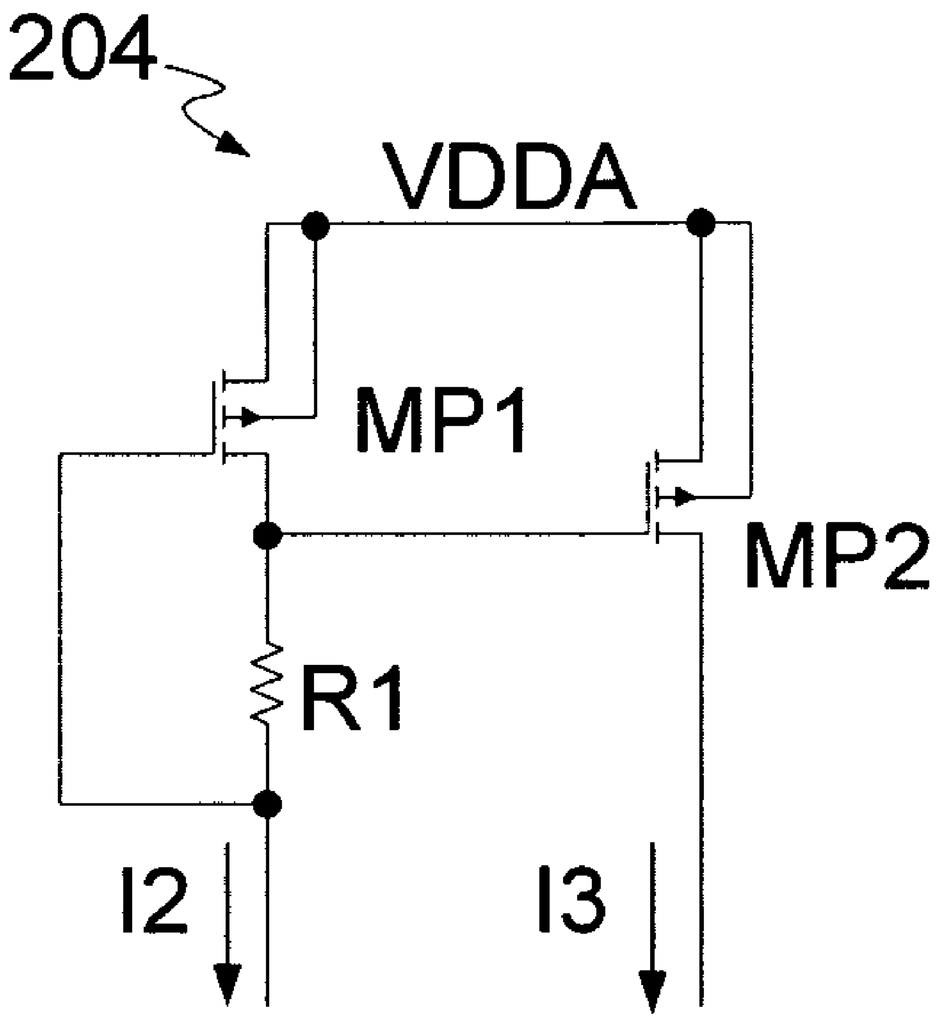
FIG. 2A is an exemplary circuit diagram of a peaking circuit for use as the first current source of FIG. 1A.

Turning to FIG. 2A, a circuit diagram of one exemplary current source 204 that may be utilized as the first current source 104*a* of FIG. 1A having a positive temperature coefficient is illustrated. The current source 204 may include PMOS transistors MP1 and MP2 and resistor R1. An alternative current source having a positive temperature coefficient may include NMOS transistors and may be utilized as the first current source 104*b* of FIG. 1B.

Figure 2B:
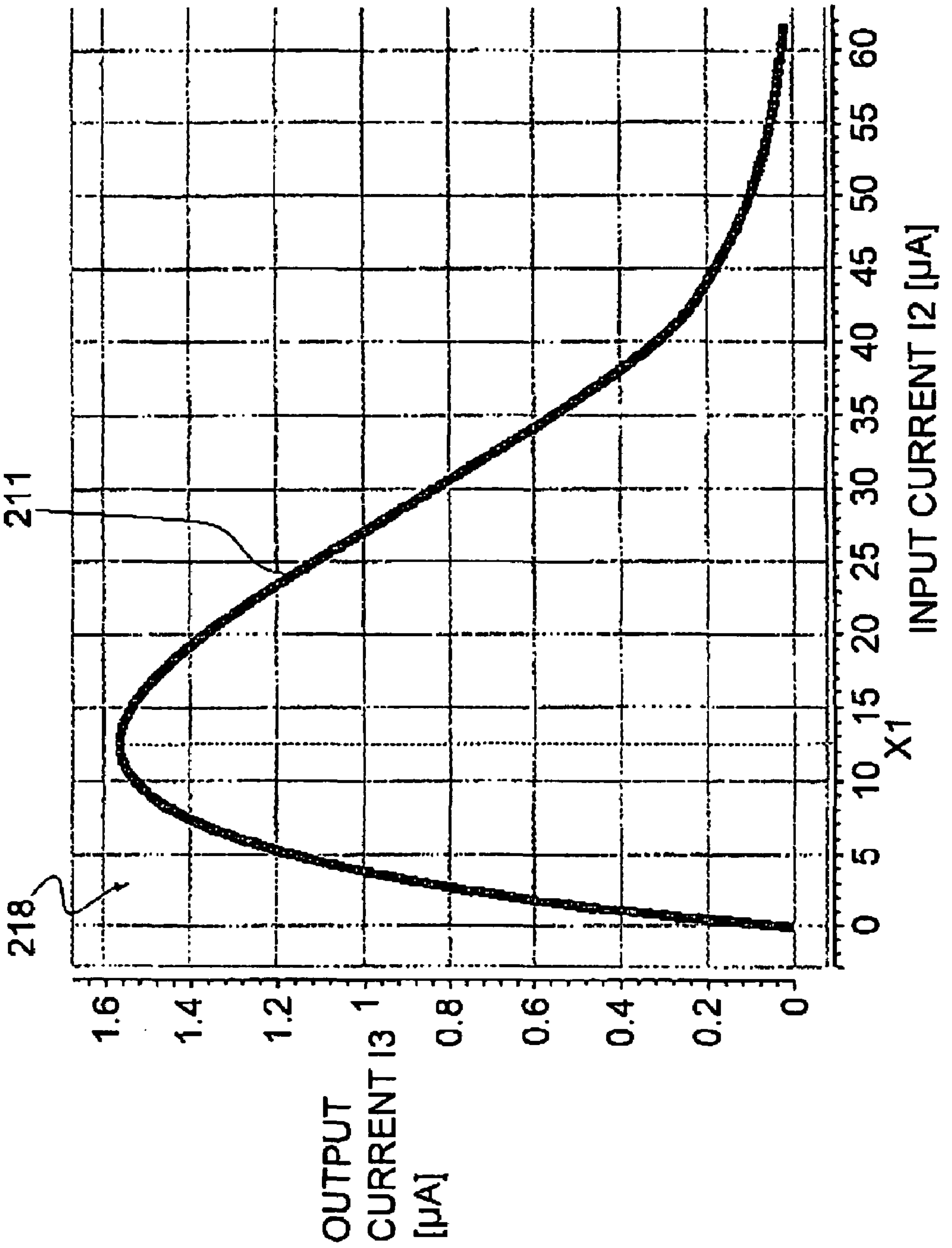
FIG. 2B is a transfer characteristic curve for the circuit of FIG. 2A illustrating output current having a peak versus input current.

In general, the current source 204 accepts an input current I2 and provides an output current I3. FIG. 2B illustrates a plot 211 of the transfer characteristic or the output current I3 versus the input current I2 of the current source 204 given a particular value for resistor R1 and transistor dimensions for MP1 and MP2. As illustrated by plot 211, the output current I3 initially rises rapidly with the input current I2, e.g., from an input current of 0 μA to about 12 μA, and then falls comparatively more slowly with further increases in input current I2. The rising and falling output current I3 results in a peak 218 output current I3 for a particular input current I2 value ×1, e.g., about 12 μA in the exemplary plot 211. This peak 218 or maximum occurs at a point when the input current I2 causes a voltage drop across R1 that is large enough to diminish the gate to source voltage $V_{GS}$ of transistor MP2. Accordingly, the current source 204 may be referred to as a peaking current source given the peaking nature of its transfer characteristic. If the input current I2 corresponds to a input current value ×1 that corresponds to the operating point at the peak 218 of the plot 211, then the output current I3 has a minimum variation with respect to the input current I2. This feature will be explored and later detailed in order to minimize supply voltage sensitivity.

Figure 2C:
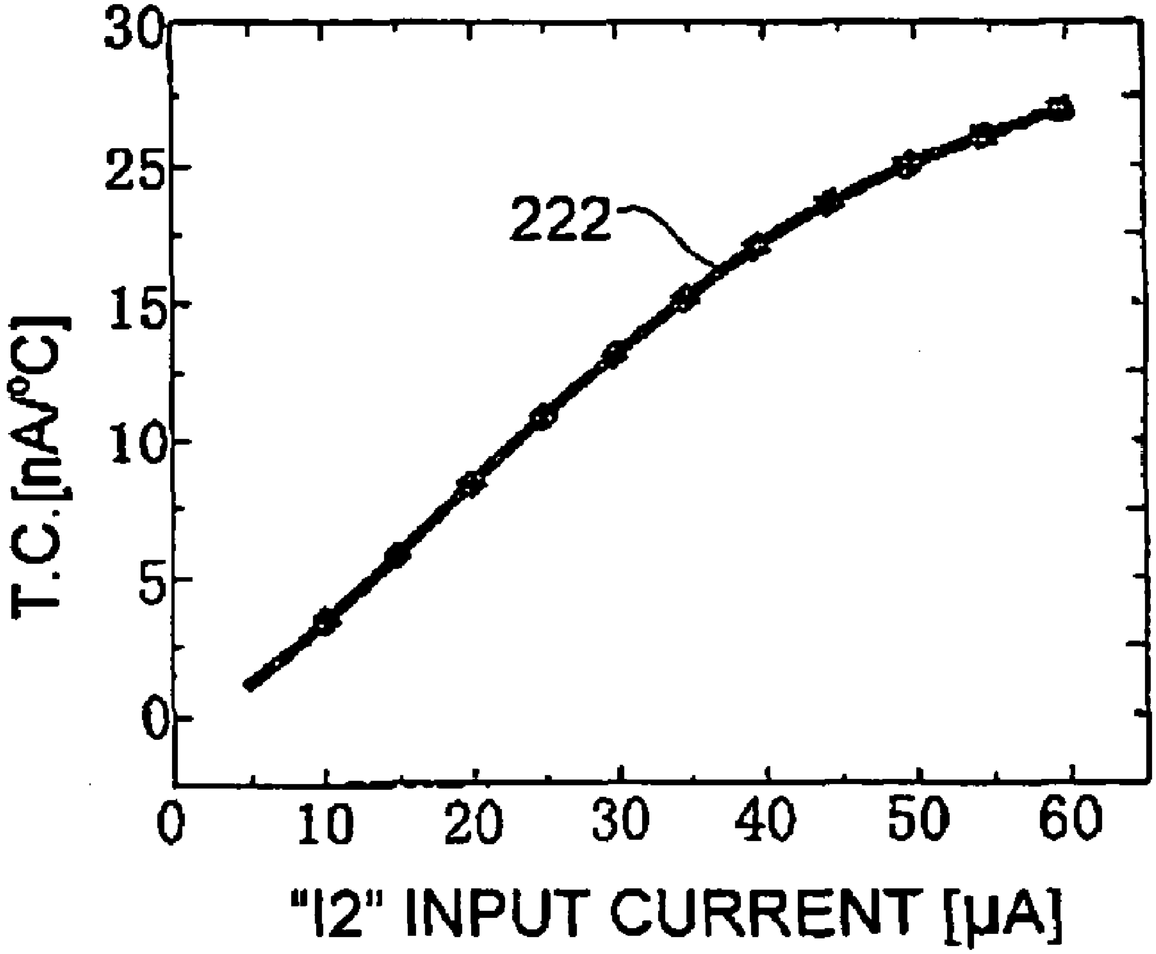
FIG. 2C is a plot of the temperature coefficient of the output current versus the input current for the circuit of FIG. 2A illustrating a positive temperature coefficient.

Turning to FIG. 2C, a plot 222 of the temperature coefficient of the output current I3 versus the input current I2 of the current source 204 is illustrated. As shown, the plot 222 has a positive slope and a quasi-linear shape until transistor MP2 enters the subthreshold conduction region.

Figure 3A:
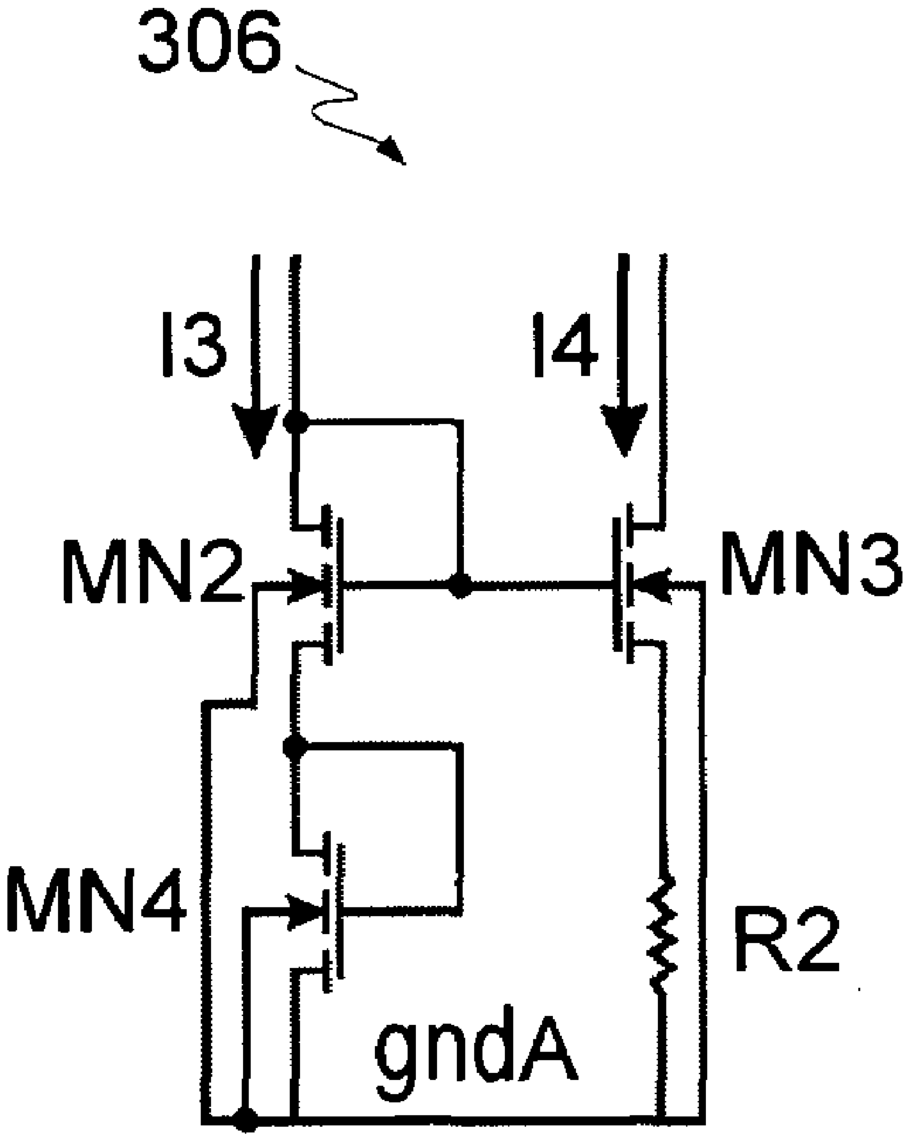
FIG. 3A is an exemplary circuit diagram of a current source for use as the second current source of FIG. 1A.

Turning to FIG. 3A, a circuit diagram of one exemplary current source 306 that may be utilized as for the second current source 106*a* of FIG. 1A having a negative temperature coefficient is illustrated. The current source 306 may include NMOS transistors MN2, MN3, and MN4 and resistor R2. An alternative current source having a negative temperature coefficient may include PMOS transistors and may be utilized as the second current source 106*b* of FIG. 1B. The current source 306 may be referred to as a $V_T$ referenced current source.

Figure 3B:
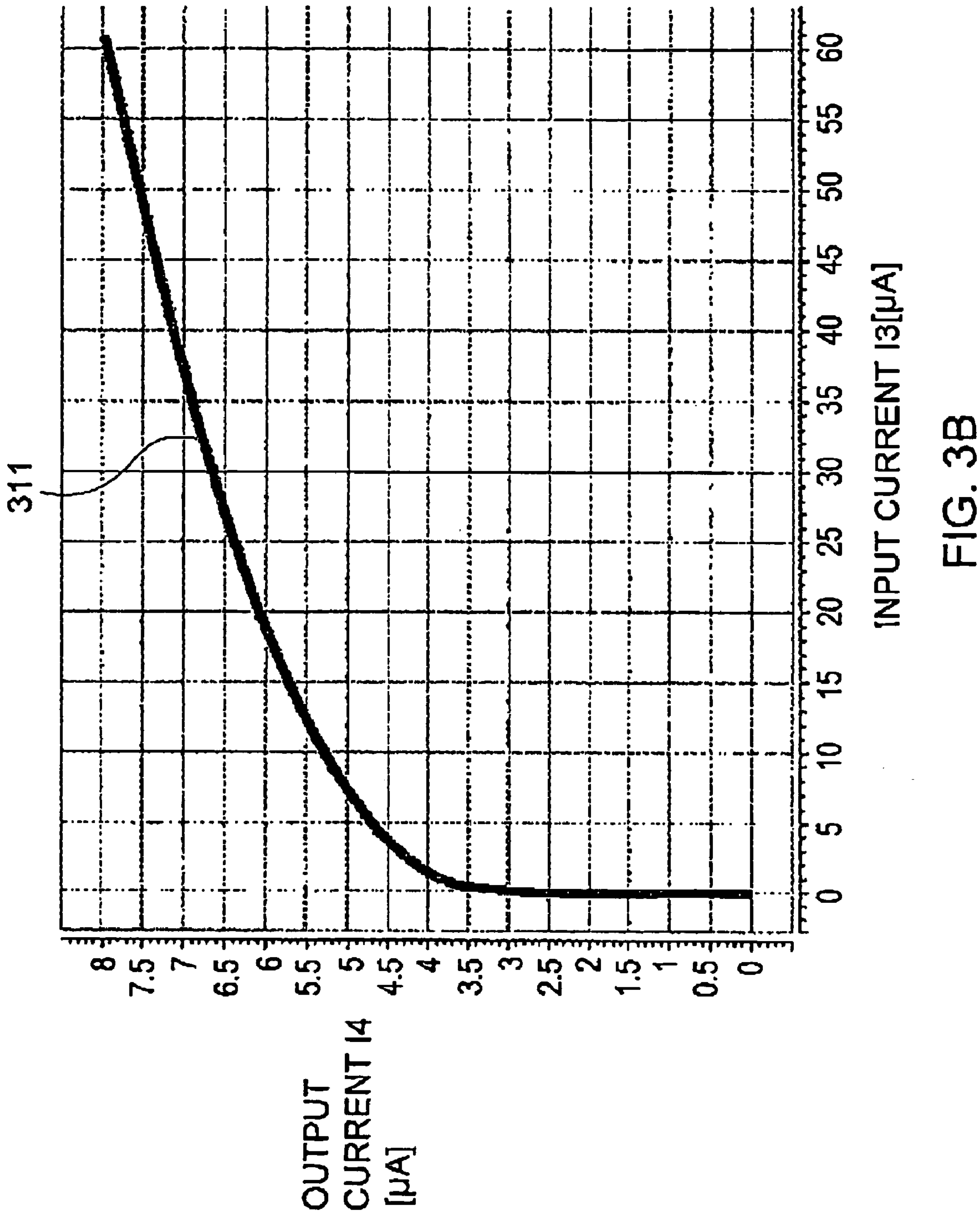
FIG. 3B is a transfer characteristic curve for the circuit of FIG. 3A.

In general, the current source 306 accepts an input current I3 and provides an output current I4. FIG. 3B illustrates a plot 311 of the transfer characteristic or the output current I4 versus the input current I3 of the current source 306 given a particular value for resistor R2. As illustrated by plot 311, the output current I4 rises with the input current I3.

Figure 3C:
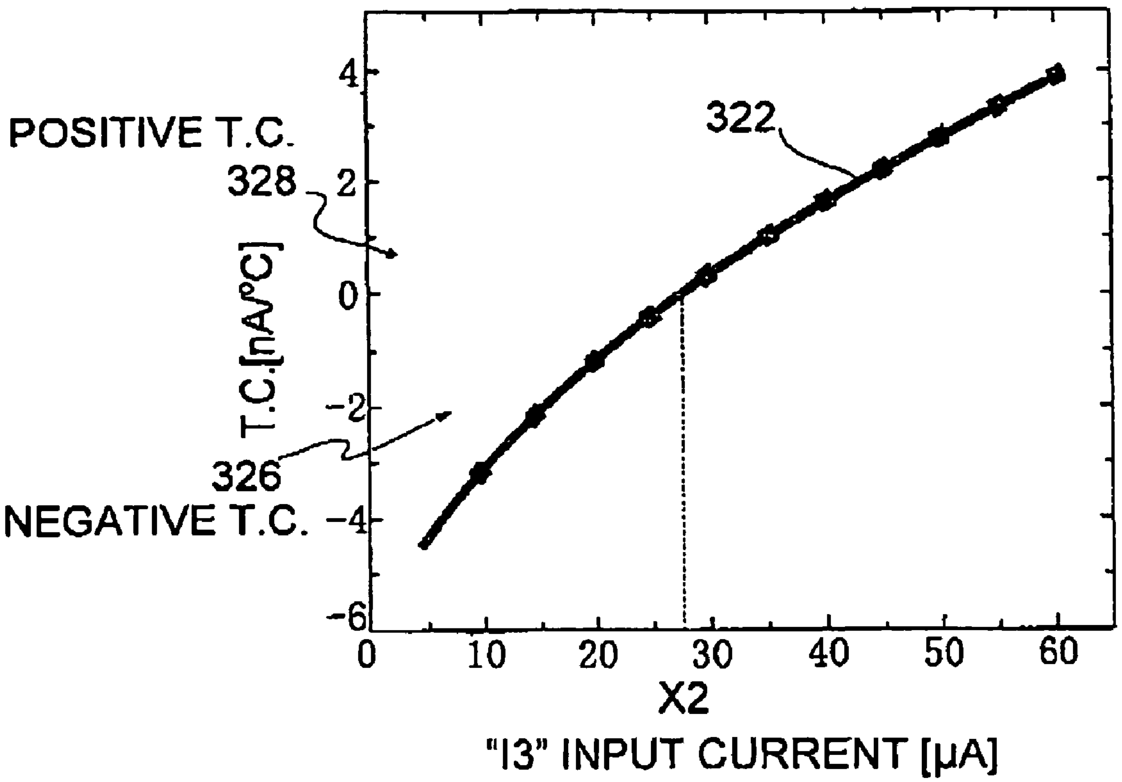
FIG. 3C is a plot of the temperature coefficient of the output current versus the input current for the circuit of FIG. 3A illustrating a negative temperature coefficient below a certain input current level.

Turning to FIG. 3C, a plot 322 of the temperature coefficient of the output current I4 versus the input current I3 of the current source 306 is illustrated. As illustrated, the plot 322 has a region 326 having a negative temperature coefficient and a region 328 having a positive temperature coefficient. If the input current I3 is below a predetermined value ×2, e.g., about 30 μA in this example, the temperature coefficient of the current source 306 is negative. If the input current I3 is above this predetermined value ×2, the temperature coefficient of the current source 306 is positive. Since the exemplary current source 306 in this instance is to provide a negative temperature coefficient, it is forced to operate in the region 326 having a negative temperature coefficient. This may be accomplished by ensuring that the input current level I3 does not exceed the predetermined level ×2. Again, a negative temperature coefficient indicates the output current I4 of the current source 306 decreases with an increase in temperature.

Advantageously, the second current source is coupled in series to the first current source. By serially combining a first current source with a positive temperature coefficient and a second current source with a negative temperature coefficient, a bias point can be chosen such that the temperature coefficient of the output current from the second current source is appropriately compensated. For instance, a bias point may be selected to effectively cancel the opposing temperature coefficients in one instance.

Figure 4:
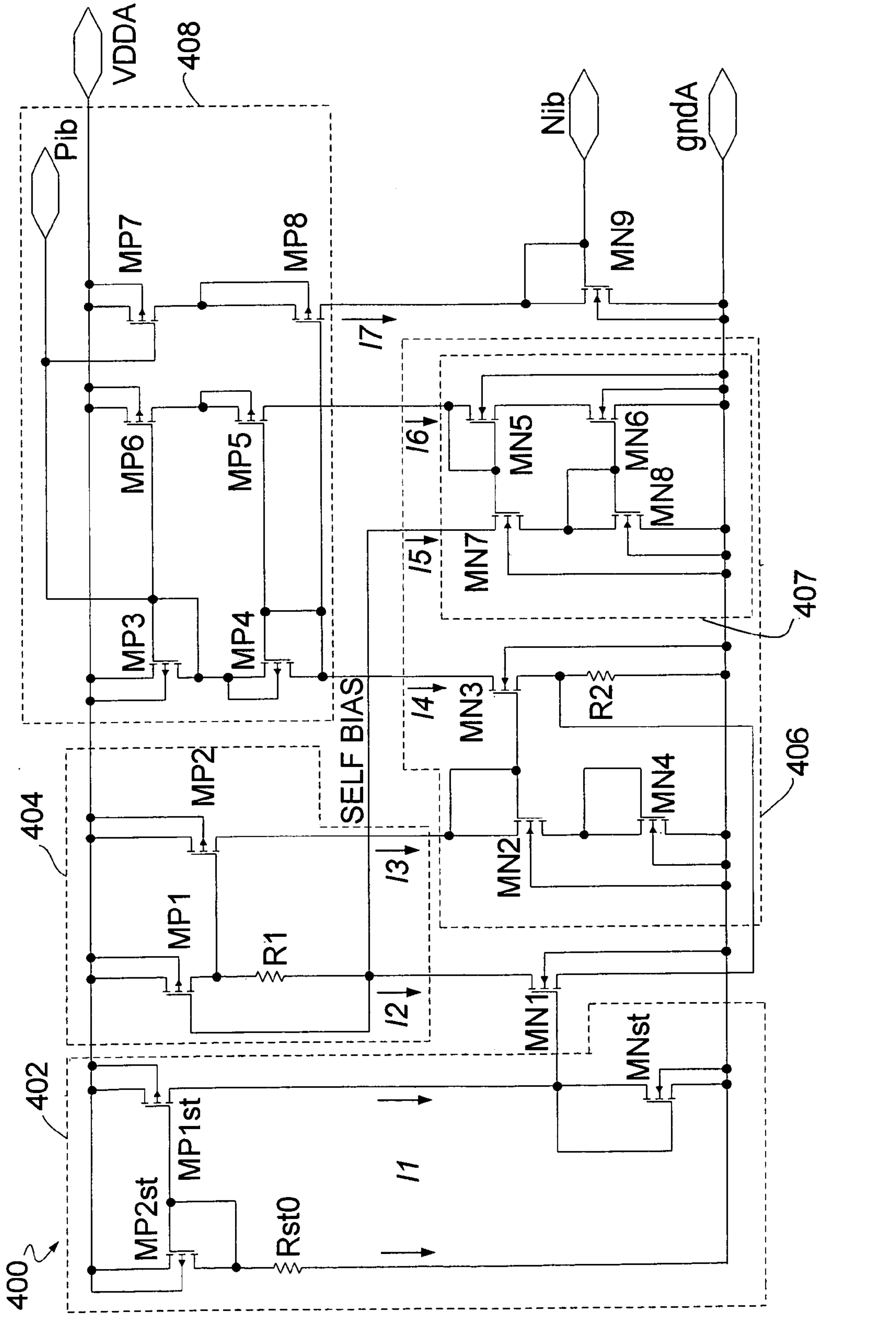
FIG. 4 is one exemplary circuit diagram of the block diagram of FIG. 1A utilizing MOSFET transistors.

Turning to FIG. 4, a circuit diagram of one exemplary compensated self-biasing current generator 400 consistent with the invention is illustrated. The circuit diagram corresponds to the block diagram of FIG. 1A having a p-type first current source 404 and an n-type second current source 406 including a self biasing circuit 407. Although the exemplary circuit 400 is illustrated using PMOS and NMOS transistors those skilled in the art will recognize that other transistor types may also be utilized. For instance, PNP and NPN transistors could be utilized by replacing the PMOS transistors with PNP transistors and the NMOS transistors with NPN transistors.

The startup circuit 402 may include startup transistors MP1*st*, MP2*st* and MN1*st* and resistor Rst0 coupled together as illustrated. The start up circuit 402 may provide a startup current I2 that is input to the first current source 404. The first current source 404 has transistors MP1, MP2 and resistor R1 coupled in a similar fashion as the earlier detailed exemplary peaking current source 204 of FIG. 2A. In general, the first current source 404 accepts an input current I2 from the startup circuit 402 and provides an output current I3. The first current source 404 has a positive temperature coefficient and has a peaking transfer characteristic where the output current I3 peaks for a predetermined input current I2 value.

The second current source 406 accepts the output current I3 from the first current source 404 and provides a temperature compensated output current I4 to the compensated current source 408. The second current source 406 includes transistors MN2, MN3, and MN4 and resistor R2 coupled together in a similar fashion as the earlier detailed exemplary current source 306 of FIG. 3A. A self-biasing circuit 407 for providing a bias current I5 to the first current source 404 may also be provided.

As soon as the temperature compensated output current I4 starts to flow, the start up switch, MN1 shuts down. The temperature compensated current I4 is fed into the compensated current source 408, which may be a standard cascode current source. The output current I6 may then be forced into the self-biasing circuit 407, e.g., an NMOS current source, and its output current I5 (temperature compensated) may then provide the input bias current for the peaking current source 404. The input bias current I5 may be input to the control terminal, e.g., the gate terminal, of PMOS transistor MP1. If the input bias current I5 corresponds to the operating point of the input current I2 at the peak of the transfer characteristic curve (see peak 218 of curve 211 of FIG. 2B), then the output current I3 of the current source 404 has minimum variation with respect to I5. This feature serves to maximize power supply rejection.

For instance, a change in the power supply voltage (VDDA) level alters the operating point of the transistors which in turn induces a change in input current. A change in input current prompts a change in output current of an associated current source as detailed by its transfer characteristic curve. For example, the output current I3 of peaking current source 204 of FIG. 2A varies with input current I2 according to the transfer characteristic curve of FIG. 2B. A power supply rejection ratio (PSRR) can be defined as the ratio between a change in output current and a change in supply voltage as detailed in equation (1) as applied to the output current I3 and supply voltage VDDA of the peaking current source 204 of FIG. 2A.

$$PSRR=\Delta I_{OUT}/\Delta V_{SUPPLY}=\Delta I3/\Delta V_{VDDA}[\text{nA/V}] \quad (1)$$

This represents the change of output current [nA] for every 1V change in supply voltage, VDDA. Equation (1) may also be expressed in dB as detailed by equation (2).

$$PSRR_{dB}=20\log_{10}(\Delta V_{VDDA}/\Delta I3) \quad (2)$$

As such, the peaking current source 204 offers the highest PSSR if operated at the peak 218 of the transfer characteristic curve 211. In other words, the output current I3 has a minimum change against variation of the input current I2 at the peak 218 of the transfer curve. Finally, the loop in FIG. 4 is closed and the output voltage at the gate ($V_{GS}$) of MP3 and MN9 can be used to bias other transistors to generate compensated current. The resistors R1, R2 may be internally integrated, trimmed, or external.

Figure 5:
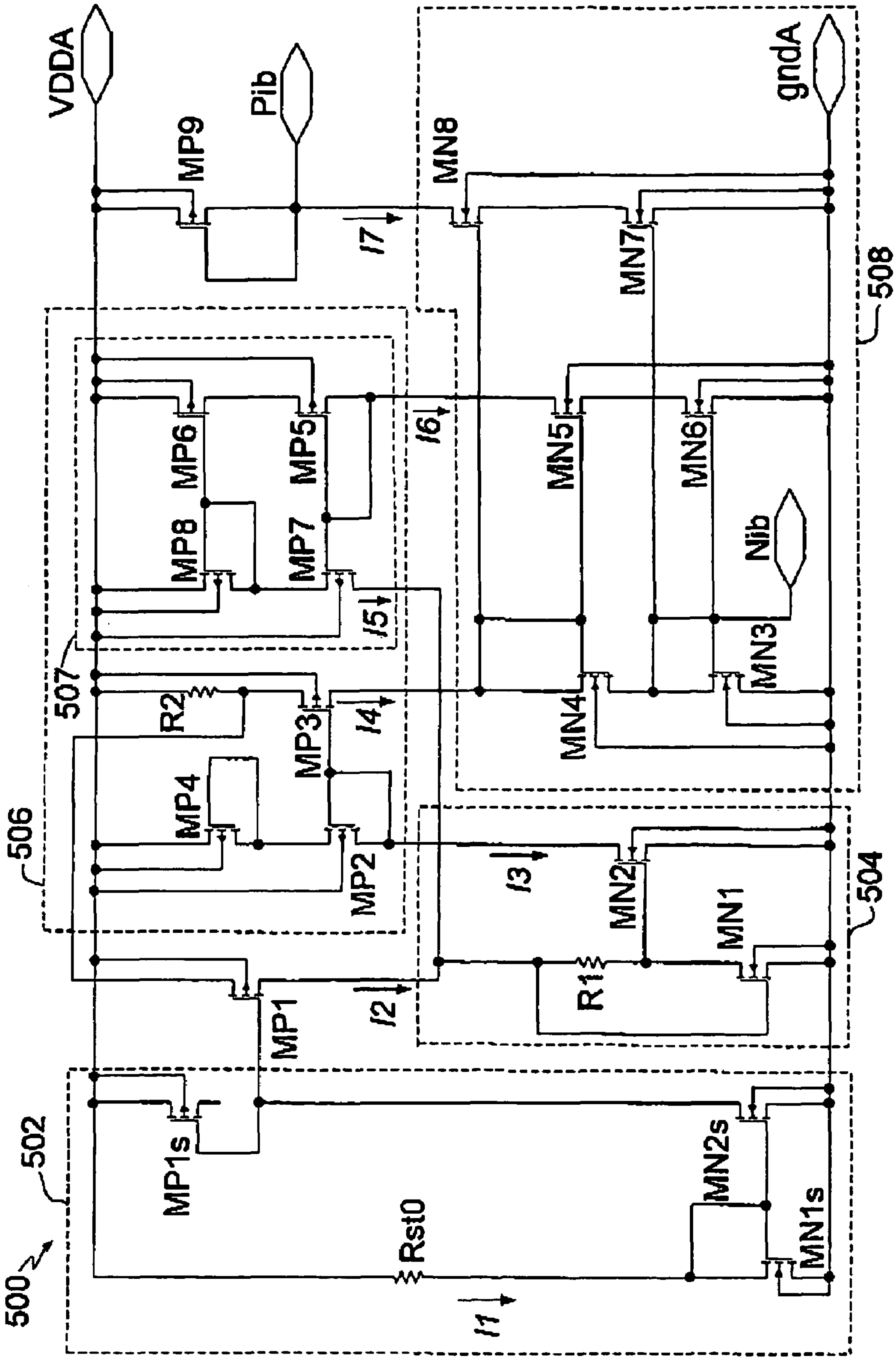
FIG. 5 is one exemplary circuit diagram of the block diagram of FIG. 1B utilizing MOSFET transistors.

Turning to FIG. 5, another circuit diagram of one exemplary compensated self-biasing current generator 500 consistent with the invention is illustrated. The circuit diagram 500 corresponds to the block diagram of FIG. 1B having an n-type first current source 504 and a p-type second current source 506. Although the exemplary circuit 500 is illustrated using NMOS and PMOS transistors those skilled in the art will recognize that other transistor types may also be utilized. For instance, NPN and PNP transistors could be utilized by replacing the NMOS transistors with NPN transistors and the PMOS transistors with PNP transistors. The compensated self-biasing current generator may include a startup circuit 502, first current source 504 with a positive temperature coefficient, a second current source 506 with a negative temperature coefficient including a self-biasing circuit 507, a compensated current source 508 and an output circuit. The output circuit may be transistor MP9 or MN3. The compensated self-bias current generator 500 of FIG. 5 basically functions similarly to that current generator 400 as earlier detailed and hence any repetitive description is omitted herein for clarity.

Figure 6:
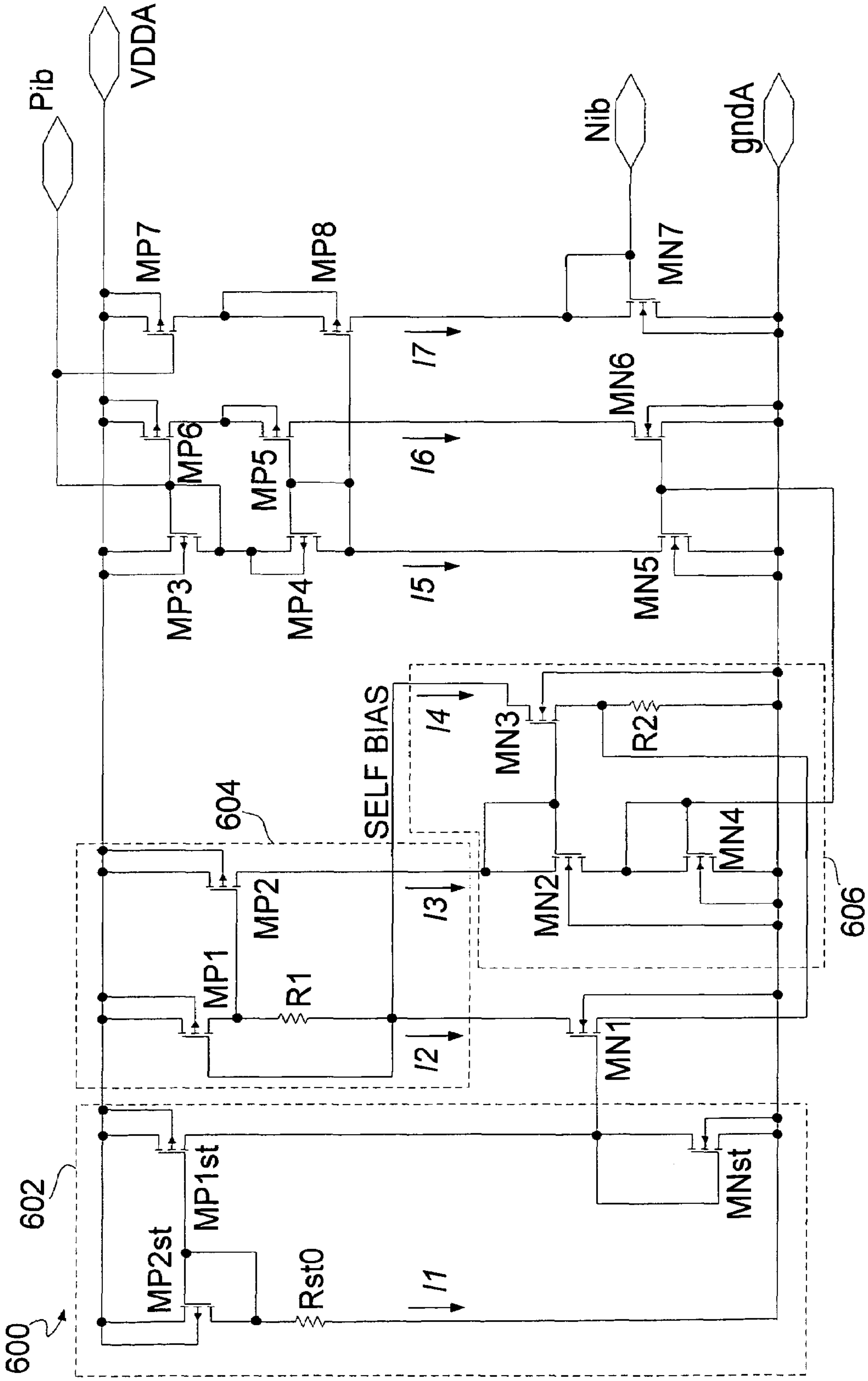
FIG. 6 is another exemplary circuit diagram of a simplified version of the block diagram of FIG. 1A where the second current source provides a self biasing signal to the first current source.

Turning to FIG. 6, yet another embodiment of a simplified compensated current generator 600 is illustrated. The compensated current generator 600 includes a start up circuit 602 and a first current source 604 similar to that of FIG. 4. Upon initial application of power during a first time interval, an initially uncompensated current I3 from the peaking source 604 is fed into the diode connected transistors MN2 and MN4 of the second current source 606. The output current, I4, of the transistor MN3 having a negative temperature coefficient is fed into the input of the peaking source 604 (which has a positive temperature coefficient in this instance), e.g., fed into the gate terminal of transistor MP1. Consequently, a temperature compensated current I3 is obtained at the output of the peaking source 604, e.g., at the output of transistor MP2 during a later time interval after the initial startup time interval. However, if the peaking source 604 is not operating at its peak output current level, a relatively low power supply rejection is obtained. The output currents I5 and I7 are mirror copies of the compensated current I3 and may be provided to other circuit components via an output circuit (transistor MP3 and MN7). In this circuit configuration, as in earlier cases, all N-channel MOSFETS can be replaced with NPN type BJTs and all P-channel MOSFETs can be replaced with PNP type BJTs.

Figure 7:
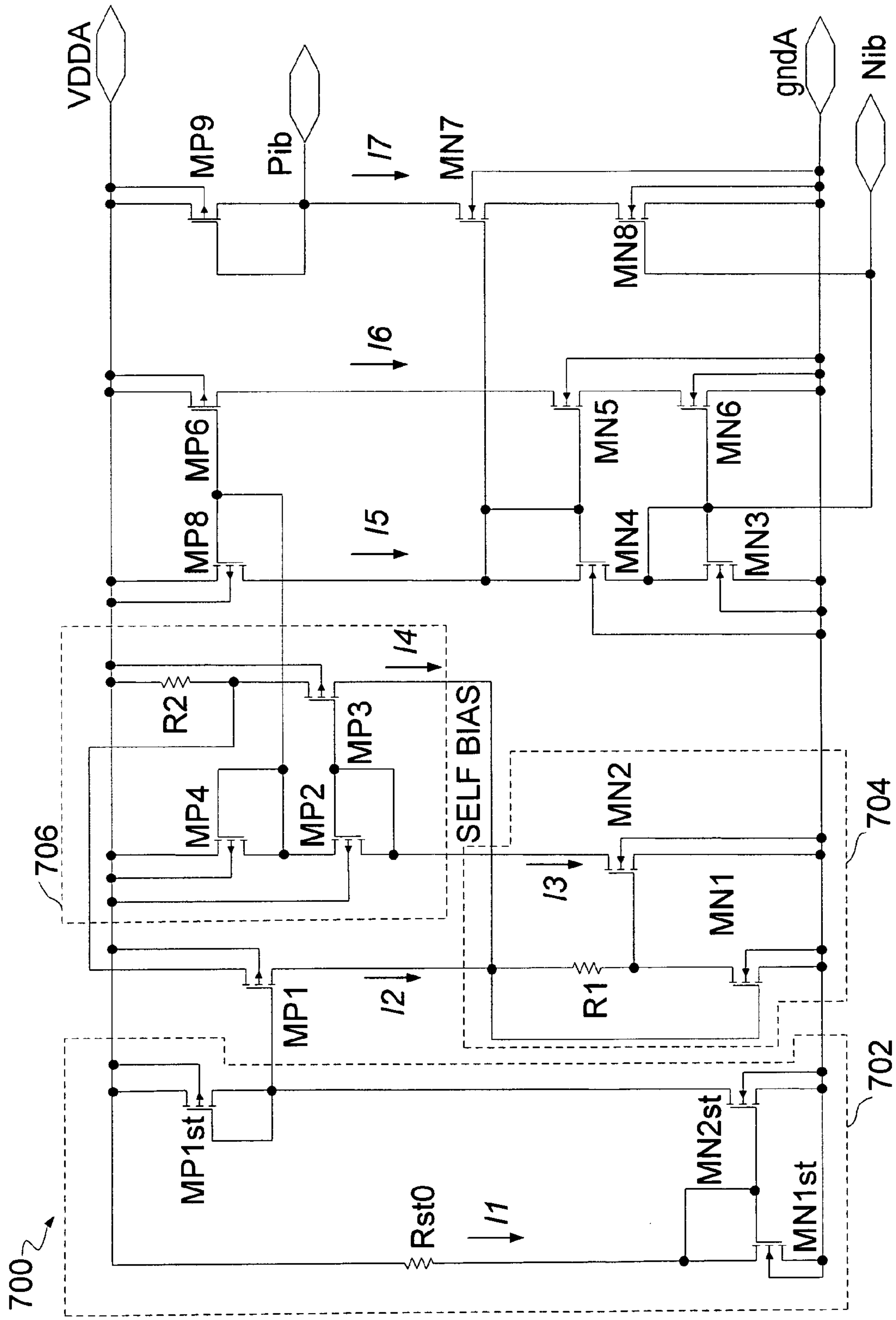
FIG. 7 is another exemplary circuit diagram of a simplified version of the block diagram of FIG. 1B where the second current source provides a self biasing signal to the first current source.

Turning to FIG. 7, yet another embodiment of a simplified compensated current generator 700 is illustrated where the peaking current source 704 is NMOS based and the second current source is PMOS based. Otherwise, the current generator 700 is similar to the current generator 600 of FIG. 6 in that the output current of transistor MP3 is fed back to the control terminal of transistor MN1 such that a temperature compensated current I3 is obtained at the output of transistor MN2 or at the output of the peaking current source 704. The output currents I5 and I7 are mirror copies of the compensated current I3, and may be provided to other circuit components via an output circuit (transistor MP9 and MN3). In this circuit configuration, as in earlier cases, all N-channel MOSFETS can be replaced with NPN type BJTs and all P-channel MOSFETs can be replaced with PNP type BJTs.

Figure 8:
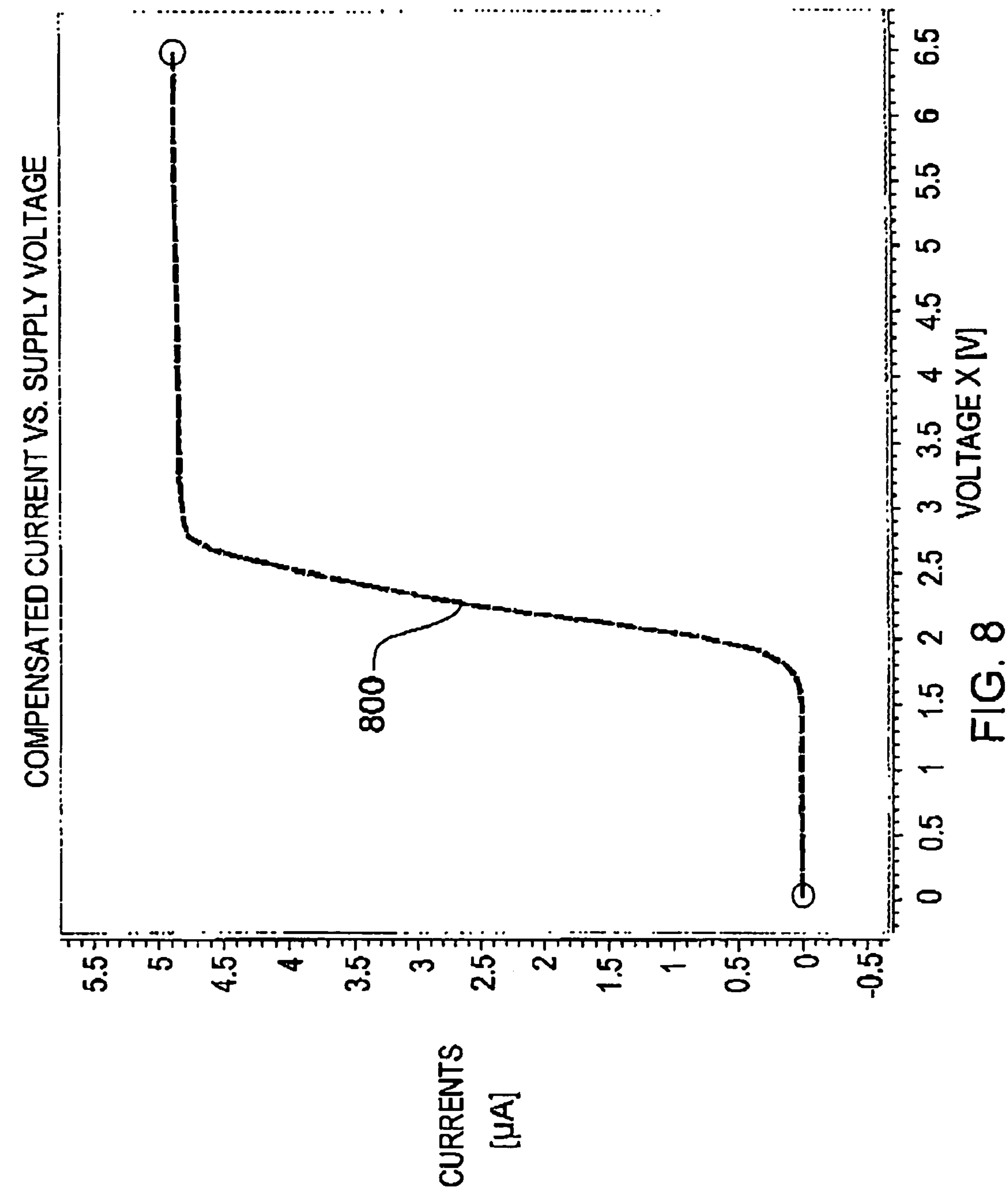
FIG. 8 is an exemplary plot of compensated current versus supply voltage illustrating the insensitivity of the compensated current to changes in supply voltage over a certain supply voltage variance range.
Figure 9:
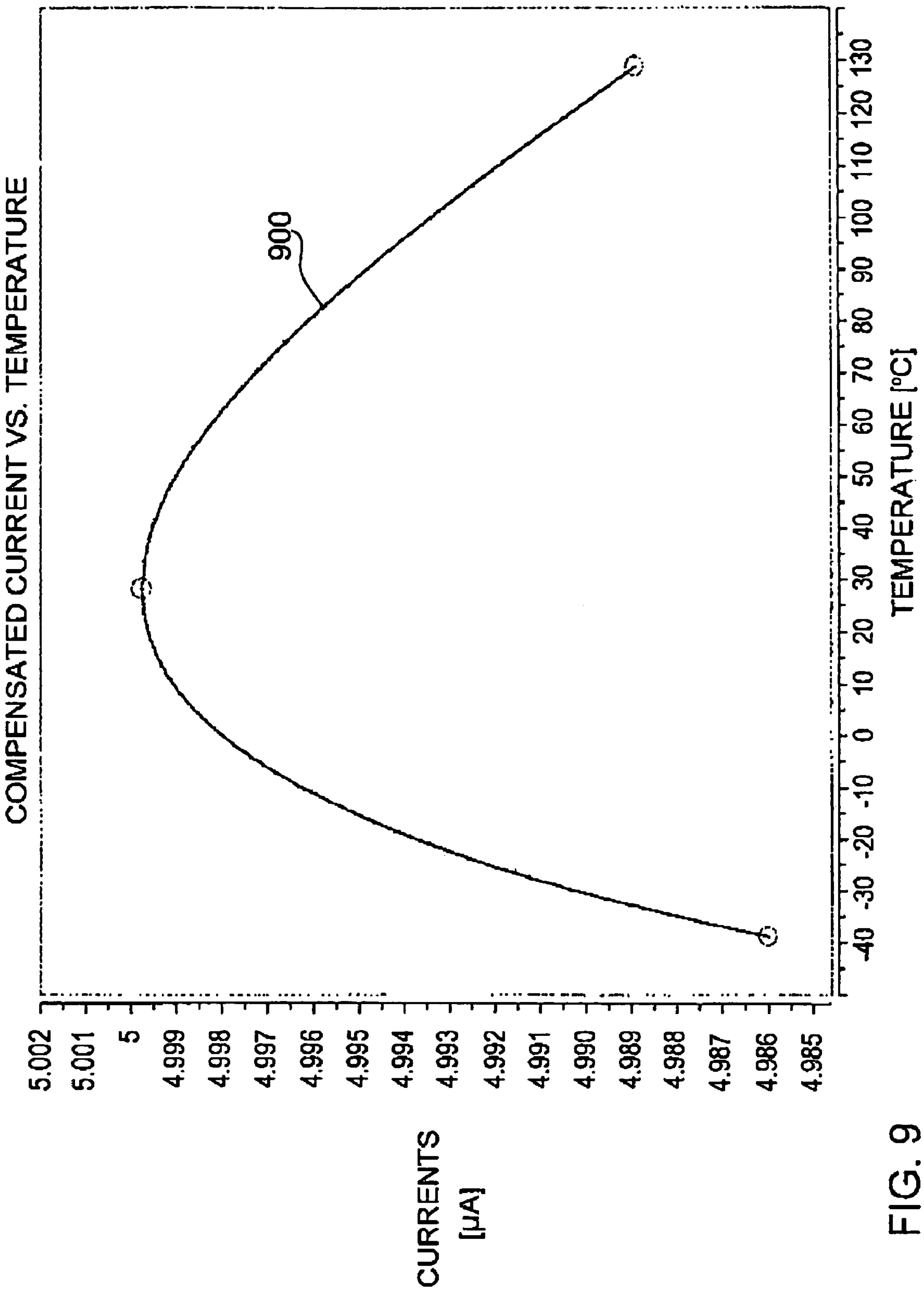
FIG. 9 is an exemplary plot of compensated versus current temperature illustrating a small variance in compensated current over a wide range of temperature from −40 degrees Celsius to +130 degrees Celsius.

A compensated self-biasing current generator consistent with the invention was designed and simulated using 0.6 μm CMOS technology with high-resistive poly resistors and the results of the compensated current over a variation in supply voltage and temperature range is illustrated in FIGS. 8 and 9. FIG. 8 illustrates a plot 800 of the compensated current versus supply voltage and reveals that when the power supply voltage varied from 4.0 volts to 6.5 volts, the reference current changed less than 20 nA thus providing excellent power supply rejection. In addition, the compensated current also exhibited stability regardless of temperature. For instance, a plot 900 of compensated current in μA versus ambient temperature over a temperature range of −40 degrees C. to +130 degrees C. reveals only a 14 nA change in current as illustrated in FIG. 9. This is much lower than a typical design target range of 5 μA over the same −40 degrees C. to +130 degrees C. range.

The embodiments that have been described herein, however, are but some of the several which utilize this invention and are set forth here by way of illustration but not of limitation. The invention may contain CMOS transistors and resistors manufactured in common IC processes. The use of BJT transistors or other transistors is also possible. It is obvious that many other embodiments, which will be readily apparent to those skilled in the art, may be made without departing materially from the spirit and scope of the invention.

What is claimed is:

1. A compensated current generator comprising:

a peaking current source having a first temperature coefficient and configured to provide a first current, said peaking current source further having a transfer characteristic curve having a peak;

a second current source having a second temperature coefficient, said second current source coupled in series with said first current source, wherein said first and second temperature coefficients have opposite signs, wherein said second current source is configured to receive said first current and provide a second temperature compensated current; and a self-biasing circuit configured to provide a bias signal to said peaking current source, said peaking current source responsive to said bias signal to operate at said peak thereby maximizing power supply rejection of said peaking current source.

2. The compensated current generator of claim 1, further comprising:

a current mirror configured to receive said second temperature compensated current and provide a third temperature compensated current, said third temperature compensated current being a mirrored version of said second temperature compensated current; and an output circuit configured to receive said third temperature compensated current and provide an output temperature compensated current.

3. The compensated current generator of claim 1, further comprising:

a startup current source configured to provide a startup current to said peaking current source.

4. A compensated current generator comprising:

a first current source having a first temperature coefficient, said first current source configured to provide a first current;

a second current source having a second temperature coefficient, said second current source coupled in series with said first current source, wherein said first and second temperature coefficients have opposite signs, wherein said second current source is configured to receive said first current and provide a second temperature compensated current; and a startup current source configured to provide a startup current to said first current source, wherein a startup switch is coupled to said startup current source, and wherein said startup switch is configured to decouple said startup current source from said first current source once said second temperature compensated current reaches a bias level.

5. The compensated current generator of claim 4, wherein said first temperature coefficient is a positive temperature coefficient and said second temperature coefficient is a negative temperature coefficient.

6. The compensated current generator of claim 4, wherein said first current source comprising a peaking current source having a transfer characteristic curve having a peak, said compensated current generator further comprising a self biasing circuit configured to provide a bias signal, said peaking current source responsive to said bias signal to operate at said peak.

7. A compensated current generator comprising:

a first current source having a first temperature coefficient configured to provide a first current during a first time interval; and a second current source having a second temperature coefficient, said second current source coupled in series with said first current source, wherein said first and second temperature coefficients have opposite signs, wherein said second current source provides a second current to said first current source, and wherein said first current source is further configured to provide a third temperature compensated current during a second time interval based on said second current, wherein said second time interval occurs after said first time interval.

8. The compensated current generator of claim 7, wherein said first temperature coefficient is a positive temperature coefficient and said second temperature coefficient is a negative temperature coefficient.

9. The compensated current generator of claim 7, wherein said first temperature coefficient is a negative temperature coefficient and said second temperature coefficient is a positive temperature coefficient.

10. The compensated current generator of claim 7, wherein said first current source comprises a peaking current source.

11. The compensated current generator of claim 7, further comprising:

a current mirror configured to mirror said third temperature compensated current and provide a fourth temperature compensated current; and an output circuit configured to accept said fourth temperature compensated current and provide an output temperature compensated current.

12. The compensated current generator of claim 7, further comprising:

a startup current source configured to provide a startup current to said first current source.

13. The compensated current generator of claim 12, wherein a startup switch is coupled to said startup current source, and wherein said startup switch is configured to decouple said startup current source from said first current source once said third temperature compensated current reaches a bias level.

14. A compensated current generator comprising:

a peaking current source having a first temperature coefficient configured to provide a first current, wherein said peaking current source has a transfer characteristic curve having a peak, said peaking current source responsive to a bias signal to operate at said peak;

a second current source having a second temperature coefficient, said second current source coupled in series with said first current source, wherein said first and second temperature coefficients have opposite signs, wherein said second current source is configured to receive said first current source and provide a second temperature compensated current;

a self-biasing circuit configured to provide said bias signal to said peaking current source, a startup current source configured to provide a startup current to said first current source, and wherein a startup switch is coupled to said startup current source, and wherein said startup switch is configured to decouple said startup current source from said first current source once said second temperature compensated current reaches a bias level;

a compensated current source configured to receive said second temperature compensated current and provide a third temperature compensated current; and an output circuit configured to receive said third temperature compensated current and provide an output temperature compensated current.

15. The compensated current generator of claim 14, wherein said first temperature coefficient is a positive temperature coefficient and said second temperature coefficient is a negative temperature coefficient.

16. The compensated current generator of claim 14, wherein said first temperature coefficient is a negative temperature coefficient and said second temperature coefficient is a positive temperature coefficient.

17. A method of compensating a current source comprising:

generating a first current in a first current source having a first temperature coefficient;

providing said first current to a second current source having a second temperature coefficient, said second current source coupled in series with said first current source, wherein said first and second temperature coefficients have opposite signs;

providing said first current during a first time interval;

providing a second current from said second current source to said first current source; and providing a third temperature compensated current from said first current source during a second time interval, wherein said second time interval occurs after said first time interval.

18. The method of claim 17, wherein said first temperature coefficient is a positive temperature coefficient and said second temperature coefficient is a negative temperature coefficient.

* * * * *